United States Patent [19]
Kawakita et al.

[11] Patent Number: 5,477,087
[45] Date of Patent: Dec. 19, 1995

[54] BUMP ELECTRODE FOR CONNECTING ELECTRONIC COMPONENTS

[75] Inventors: Tetsuo Kawakita, Takatsuki; Kenzo Hatada, Katano, both of Japan

[73] Assignee: Matsushita Electric Industrial Co., Ltd., Osaka, Japan

[21] Appl. No.: 341,842

[22] Filed: Nov. 18, 1994

Related U.S. Application Data

[63] Continuation of Ser. No. 25,607, Mar. 3, 1993, abandoned.

[30] Foreign Application Priority Data

Mar. 3, 1992 [JP] Japan ..................... 4-045333

[51] Int. Cl.⁶ .................. H01L 21/283; H01L 23/482; H01L 29/43
[52] U.S. Cl. ............. 257/737; 257/778; 257/779
[58] Field of Search .................. 257/673, 737, 257/738, 782, 783, 778, 779, 773

[56] References Cited

FOREIGN PATENT DOCUMENTS

| 0007758 | 1/1985 | Japan | 257/737 |
| 0177540 | 7/1990 | Japan | 257/737 |
| 0237129 | 9/1990 | Japan | 257/737 |
| 0280334 | 11/1990 | Japan | 257/737 |
| 0006841 | 1/1992 | Japan | 257/737 |

OTHER PUBLICATIONS

Translation of Japan Kokai Publication #04–006841 (Jan. 10, 1992) to Saito et al. 11 pages.

*Primary Examiner*—William Mintel
*Assistant Examiner*—Peter Toby Brown
*Attorney, Agent, or Firm*—Ratner & Prestia

[57] ABSTRACT

The present invention relates to connecting electronic components using bump electrodes to connect electronic components such as semiconductors with the patterning electrodes of a circuit board. In order to prevent deterioration in connecting reliability due to deformation and the like of semiconductors and circuit boards, it is necessary to have some elasticity incorporated within bump electrodes. The bump electrodes disclosed by the present invention have resin bumps with numerous cavities disposed within and covered by a low melting point metal layer. According to this composition, even when there are some variations of distribution in circuit board warp and bump electrode height, it is possible to absorb the variations through the elasticity presented by the bump electrodes. It is also possible to perform a low strain connection with a resultant enhancement in connecting reliability at high temperature.

4 Claims, 7 Drawing Sheets

5,477,087

BUMP ELECTRODE FOR CONNECTING ELECTRONIC COMPONENTS

This application is a continuation of application Ser. No. 08/025,607 filed Mar. 3, 1993 and now abandoned.

BACKGROUND OF THE INVENTION

The present invention relates to an apparatus and method for mounting electronic components such as semiconductors on circuit boards or film carriers,.

A known method for connecting the bump electrodes of a semiconductor to the patterning electrodes of a circuit board is press-bonding the components with an insulating resin between the semiconductor and the circuit board. This method is referred to as microbump bonding. This microbump bonding method is depicted in FIG. 9.

In FIG. 9(a), circuit board 51 is composed on a material such as glass or ceramics. Patterning electrode 52 is formed on circuit board 51. A drop 53 of a light setting insulation resin is placed at a position on the circuit board where an LSI chip 13 is aligned with patterning electrode 52. Bump electrode 81 is usually formed on aluminum electrode 14 with a barrier-metal such as Ti/Pd/Au or Cr/Au placed between them.

To date, bump electrode 81 has only been comprised of a metallic material such as gold or solder. Also to date, bump electrode 81 has been formed on aluminum electrode 14 of the LSI chip 13 either directly by an electrolytic plating method, or through a transferring method whereby metal bumps formed on a separate metal substrate are transferred to the surface of aluminum electrode 14 of LSI chip 13.

As illustrated in FIG. 9(c), LSI chip 13 is applied with a pressing force exerted through a pressure application tool 42.

Insulation resin 53 under bump electrode 81 is completely displaced, and bump electrode 81 is compressed to complete an electrical connection with patterning electrode 52.

Then, ultraviolet rays 54 are irradiated for curing the light setting insulation resin 53, as shown in FIG. 9.

When the circuit board is formed of a transparent material such as glass, the ultraviolet rays are irradiated from the back side of circuit board 51. When the circuit board is not transparent, the ultraviolet ray irradiation is applied from the side where LSI chip 13 is mounted. When the resin is cured and pressure application tool 42 is removed, the connection between LSI chip 13 and circuit board 51 is completed, as shown in FIG. 9(e).

The aforementioned prior art method has the following problems:

1) As the number of connecting pins increases, their weight becomes so large as to make the semiconductor and the circuit board liable to deform. This leads to deterioration in connecting reliability and sometimes to damage of the semiconductor itself.

2) The pressure application on tens to hundreds of electrodes formed on semiconductors has to be applied uniformly. Very high accuracy has to be realized in the flatness of both the pressure application tool and the opposing surface of the circuit board. The degree of accuracy required increases as the number of connecting pins increases and the chip size becomes large. This high degree of accuracy is difficult to meet. Even a small variation in the height distribution of the bump electrodes, by 3 to 5 um for example, or a slight warp of the circuit board will cause failures in connection.

3) Also, when the semiconductors are turned on to operate, the heat generated from the semiconductors tends to bring about straining and warping of the materials used. This straining and warping is due to differences in the thermal expansion coefficient and also leads to failures in connection between the bump electrodes and the circuit board electrodes.

The connection failures described above take place not only with the microbump bonding method but also with the flip-chip bonding method that uses solder bumps.

SUMMARY OF THE INVENTION

In an exemplary embodiment of the present invention, each bump electrode of a plurality of bump electrodes comprises a resin bump having at least one cavity within the bump and a metal layer covering the resin bump surface.

As a result, the bump electrodes have elasticity and are compressed to ensure a good connection despite even when there exist variations in the bump electrode height and warps in the circuit board.

DETAILED DESCRIPTION OF THE INVENTION

Figure 1:
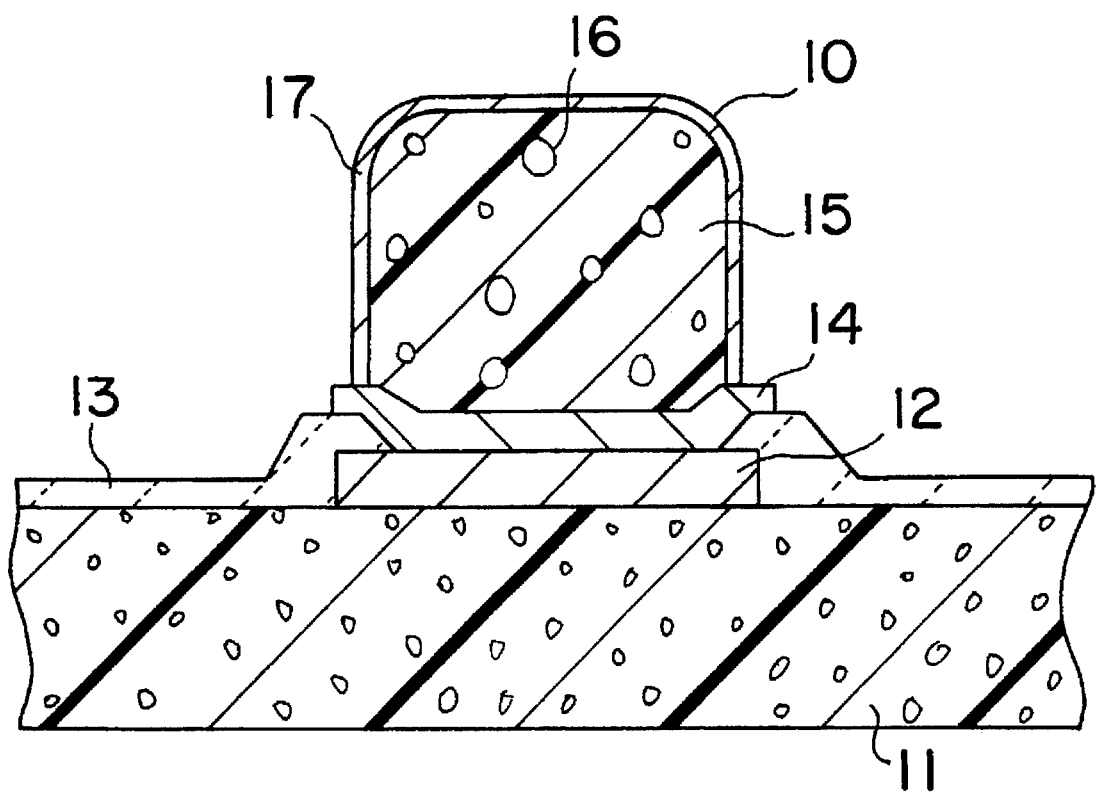
FIG. 1 is a cross-sectional view of an exemplary embodiment of the apparatus of the present invention.

FIG. 1 is a cross-sectional view of an exemplary embodiment of the apparatus of the present invention.

In FIG. 1, item 10 is a bump electrode formed on an LSI CHIP 11, item 12 is an aluminum electrode, item 13 is an insulating layer formed of Si02 or the like, item 14 is a barrier-metal layer, item 15 is resin, item 16 is a cavity and item 17 is a metal layer.

The exemplary embodiment of the present invention has a bump electrode 10 that is comprised of a resin bump 15 having numerous cavities 16 disposed within and a metal layer 17 covering the resin bump surface.

Metal layer 17 is comprised of a low melting point metal such as Sn, In or solder. The resin 15 is a heat-resisting resin such as a silicon system, fluorocarbon system or polymide system resin.

FIG. 2 shows a series of cross-sectional views illustrating how the bump electrodes of FIG. 1 are made.

Figure 2A:
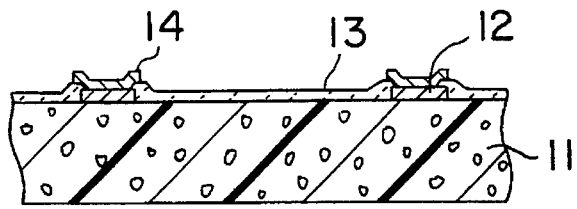
FIGS. 2(a)–2(f) are a series of cross-sectional views illustrating the steps of fabricating the apparatus of FIG. 1.

After an aluminum electrode 12 and an insulating layer 13 are formed on an LSI chip 11, a barrier-metal coating is applied all over the surface, as shown in FIG. 2(a).

The barrier-metal coating is comprised of Ti/Pd/Au, Cr/Au or the like and its thickness ranged from 0.1 to 0.3 um.

Then, the barrier-metal layer 14 is formed by etching off the barrier-metal coating by means of a lithography method except for the regions corresponding to the aluminum electrodes 12. After this step, the photoresist is removed.

Next, a foaming agent and a foam settling agent are mixed with a photosensitive resin.

Photosensitive polyimide is used as the photosensitive resin in this example.

Polyol polyisocyanate is used as the foaming agent and a silicon system foam settling agent such as dimethyl polysiloxane or dimethyl polyoxy alkylene copolymer is used as the foam settling agent.

Figure 2B:
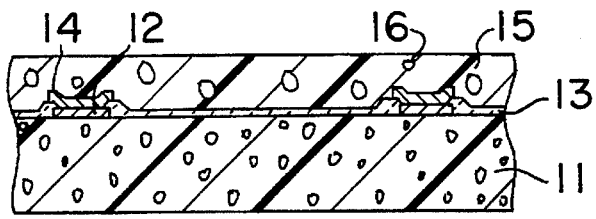

Upon mixing, the foaming agent reacts and carbonic acid gas is generated. The generated carbonic acid gas is captured in a uniform and stable manner throughout the resin due to the effects of the foam settling agent. This results in production of resin 15 having numerous cavities 16 within. This resin is coated all over the upper surface of the LSI chip 11 to the thickness of 10 to 30 um by means of a spin coat method, as shown in FIG. 2(b). Then, the resin 15 is cured at around 80° C.

Figure 2C:
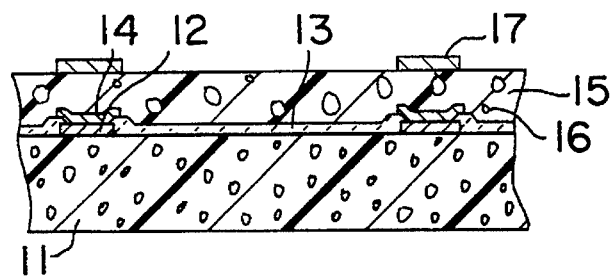

As shown in FIG. 2(c), a low melting point metal layer 17 comprised of indium and the like is formed by deposition over the resin 15 to the thickness of 0.8 to 1.5 um. Then all of the low melting point metal layer 17 is etched off except for the places corresponding to the aluminum electrodes 12 and the barrier-metal layers 14.

Figure 2D:
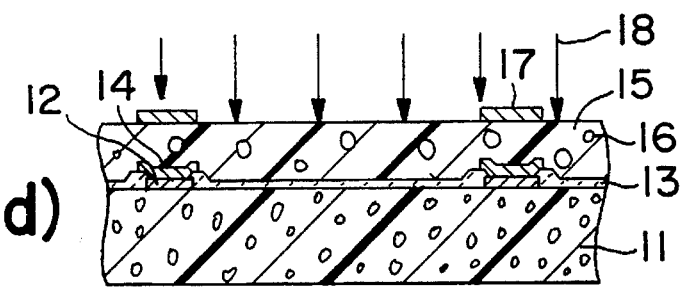

Then, ultraviolet rays 18 are irradiated on the resin surface with the low melting point metal layer 17 serving as a mask, as shown in FIG. 2(d).

Figure 2E:
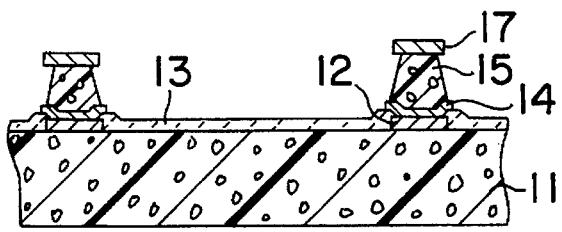

As shown in FIG. 2(e), the resin 15 remains only on the aluminum electrode 12 and the barrier-metal layer 14 after development in a development solution.

Figure 2F:
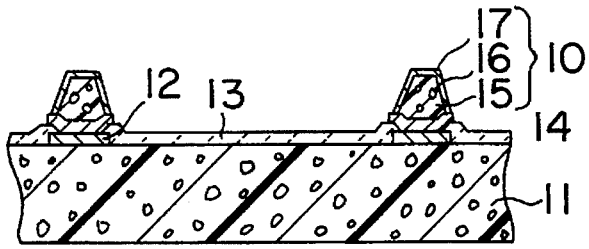

After this step, as shown in FIG. 2(f), the resin 15 is cured. At the same time the low melting point metal layer 17 is molten to cover the entire surface of the resin bumps 15 when subjected to a heat treatment at around 300° C.

Accordingly, bump electrodes 10 are obtained, each having a resin bump 15 with numerous cavities 16 disposed within and with the surface thereof coated with a low melting point metal layer 17.

FIG. 2 describes how bump electrodes are formed on aluminum electrodes on an LSI chip. The bump electrodes can also be formed by the same method on patterning electrodes of a circuit board.

This is illustrated in FIG. 3.

Figure 3A:
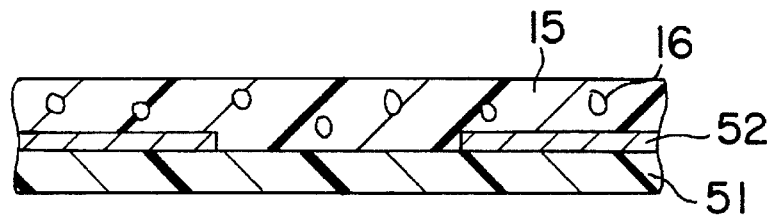
FIGS. 3(a)–3(e) are a series of cross-sectional views illustrating the steps of forming bump electrodes on a circuit board.
Figure 3B:
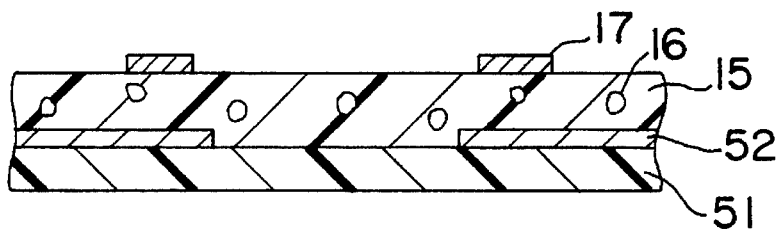

First, as shown in FIG. 3(a), resin 15 with cavities 16 disposed within, as was described in FIG. 2, is coated over patterning electrodes 52 formed on a circuit board 51 by means of a spin-coat method to the thickness of 10 to 30 um. Then, as shown in FIG. 3(b), a low melting point layer 17 is formed over resin layer 15 at places above the patterning electrodes 52 and corresponding to where aluminum electrodes of an LSI chip are located.

Low melting point metal layer 17 is formed as explained in FIG. 2

Figure 3C:
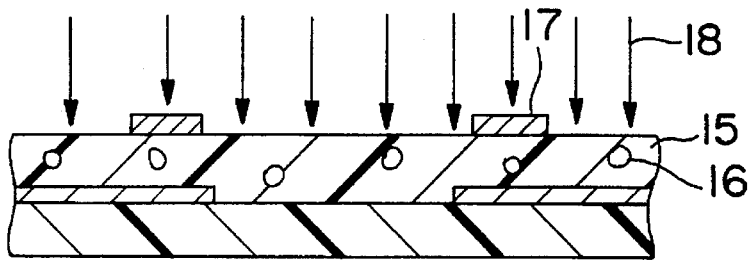

Next, as shown in FIG. 3(c), ultraviolet rays 18 are irradiated on the resin layer with the low melting point metal layer 17 used as a mask.

Figure 3D:
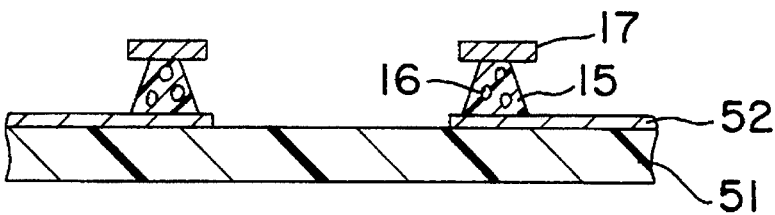

As shown in FIG. 3(d), the resin bumps 15 remain after development in a developing solution on the patterning electrodes 52 and at the places corresponding to where the aluminum electrodes of the LSI chip are located.

Figure 3E:
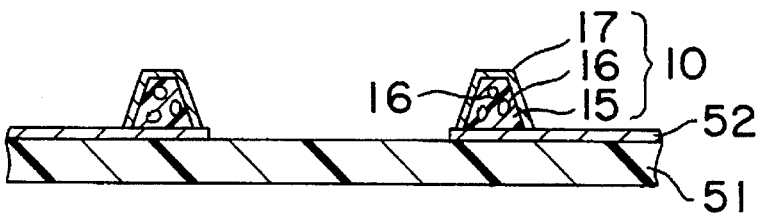

After this step, as shown in FIG. 3(e), the resin bumps 15 are cured. At the same time the low melting point metal layers 17 are molten to cover the entire surface of the resin bumps 15 when subjected to a heat treatment at around 300° C.

In this way, bump electrodes 10, each having a resin bump 15 with numerous cavities 16 disposed within and with the surface thereof coated with a low melting point metal layer 17, are formed on a circuit board 51.

As another method of forming the bump electrodes 10 of the aforementioned composition on the aluminum electrodes 12, there is a method wherein the bump electrodes only are formed on a separate substrate and then moved onto the aluminum electrodes by means of a transfer method. This method is illustrated in FIG. 4.

First, bump electrodes 10 are formed on a glass substrate 41 at places corresponding to where aluminum electrodes 12 of an LSI chip 11 are located according to the same steps as were illustrated in FIG. 2.

Figure 4A:
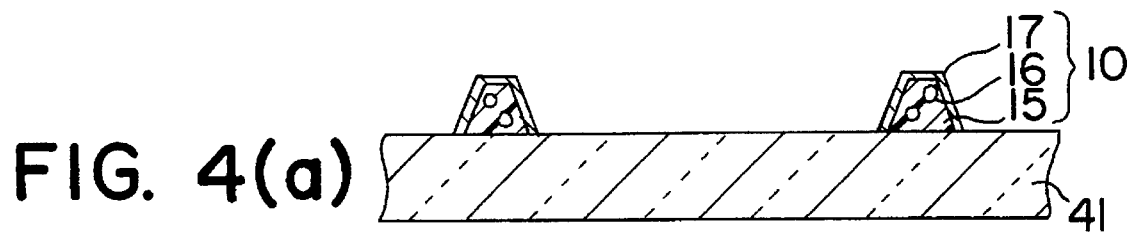
FIGS. 4(a)–4(d) are a series of cross-section views illustrate how bump electrodes formed on a separate circuit board are transferred onto electrodes of a semiconductor.
Figure 4B:
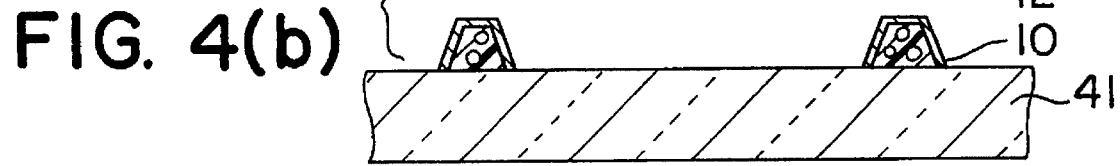
Figure 4C:
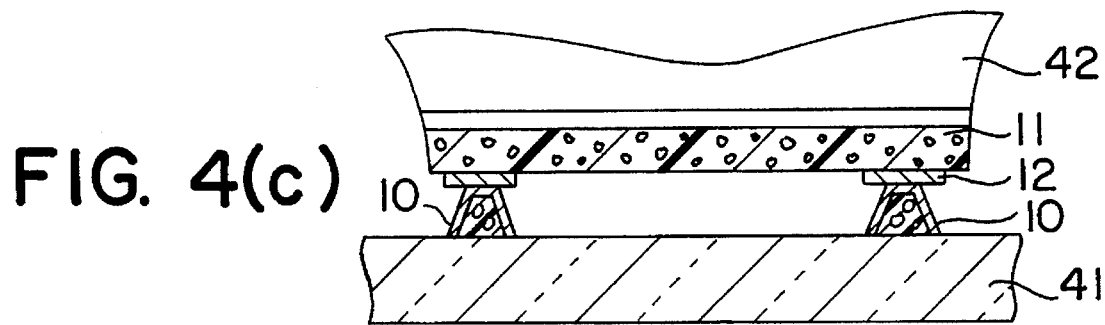

Then, as shown in FIG. 4(b), the bump electrodes 10 formed on the glass substrate 41 are aligned with the aluminum electrodes 12 of the LSI chip 11 and joined with aluminum electrodes 12 through application of heat and a pressing force applied by means of a pressure application tool 42, as illustrated in FIG. 4(c).

At this time, the temperature of the pressure application tool 42 ranges from 300° to 400° C. and the pressing force ranges from 10 to 20 g/bump.

Figure 4D:
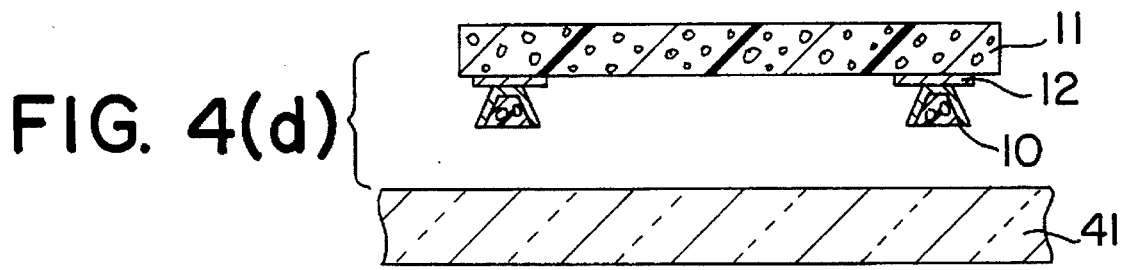

As illustrated in FIG. 4(d), transfer of the bump electrodes 10 onto the aluminum electrodes 12 is completed when the pressure application tool 42 is removed.

Thus, a metallic bump electrode 10 having a composition wherein cavities 16 are disposed in a resin bump 15 can be formed on an aluminum electrode 12 of an LSI chip 11.

FIG. 5 illustrates how an LSI chip having bump electrodes 10 is connected to a circuit board.

Figure 5A:
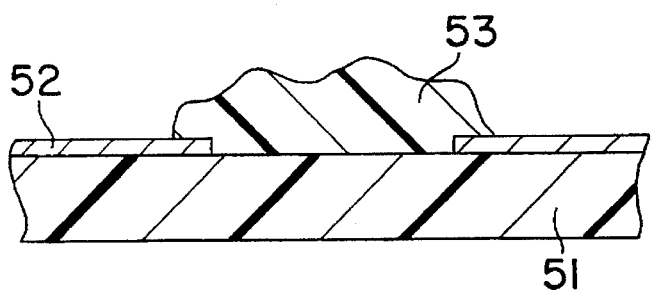
FIGS. 5(a)–5(d) are a series of cross-sectional views illustrating how the electronic components are connected to a circuit board according to the present invention.

First, as shown in FIG. 5(a), a light setting insulation resin 53 is coated over a circuit board 51 having patterning electrodes 52 in the areas where LSI chips are mounted. The circuit board 51 is comprised of glass or ceramics and the light setting insulation resin 53 is comprised of a resin of epoxy system, acrylic system, silicon system or the like.

Figure 5B:
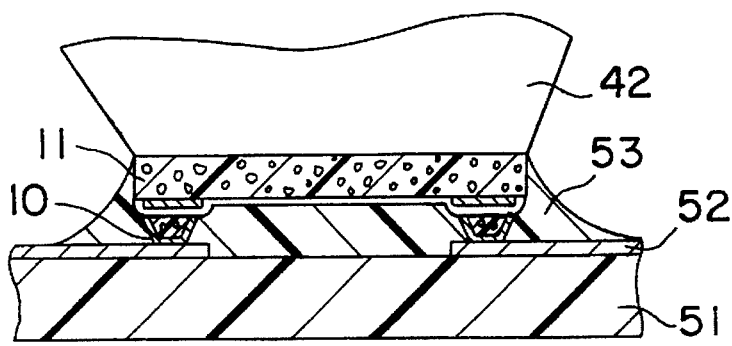

Then, as shown in FIG. 5(b), the bump electrodes 10 formed on the LSI chip 11 are aligned with the patterning electrodes 52 of the circuit board. 51 and then compressed by means of a pressure application tool 42.

At this time, the insulation resin 53 is stretched out to the periphery of the LSI chip 11.

The magnitude of the pressing force applied here is large enough to cause an elastic deformation, yet falling short of causing a complete non-elastic deformation, to the bump electrodes 10. In other words, the pressing force is set to a magnitude whereby the volume of the bump electrodes 10 is compressed by 10 to 30%.

Figure 5C:
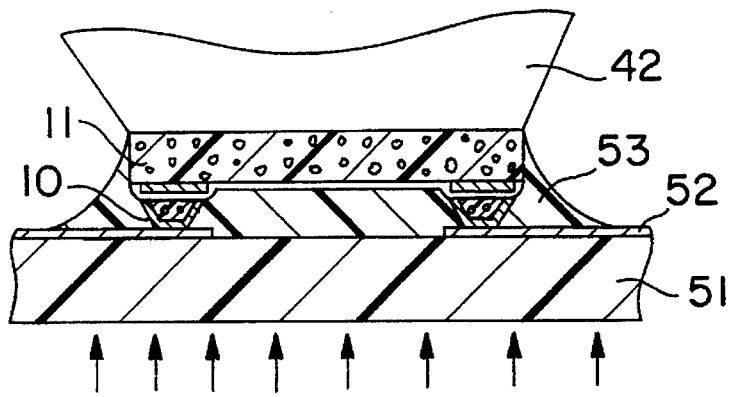

After the light setting insulation resin 53 is irradiated by ultraviolet rays 54 for curing as shown in FIG. 5(c), the applied pressure is removed.

As a result, the LSI chip 11 is fixed on the circuit board 51 and the bump electrodes 10 formed on the aluminum electrodes 12 of the LSI chip 11 are kept in contact with the circuit board 51 to complete electrical connection. When the circuit board 51 is formed of transparent material like glass, the ultraviolet rays 54 are to be irradiated from the back side of the board for curing the light setting insulation resin 53. When a non-transparent material like ceramics is used as the circuit board, the ultraviolet rays are to be irradiated from the side of the LSI chip 11.

FIG. 5 is an example wherein the bump electrode is formed on the LSI chip 11 that was connected to the circuit board 51, The bump electrode 10 could also be formed on a patterning electrode 52 of the circuit board 51.

Figure 5D:
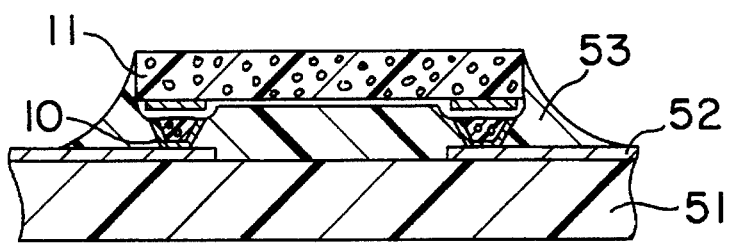

For instance, after a bump electrode 10 is formed on the patterning electrode 52 of the circuit board 51 as illustrated in FIG. 5(a) according to the method shown in FIG. 3, the bump electrode 10 is aligned with an opposing aluminum electrode 12 of the LSI chip 11 and connection is performed by the same steps as illustrated in FIGS. 5(b) through 5(d).

As a result of experiments, when the distance r between the LSI chip 11 and the patterning electrode 52 was changed by Δr, it was found that a good connection was maintained even for Δr ranging from 3 to 5 um.

Figure 6:
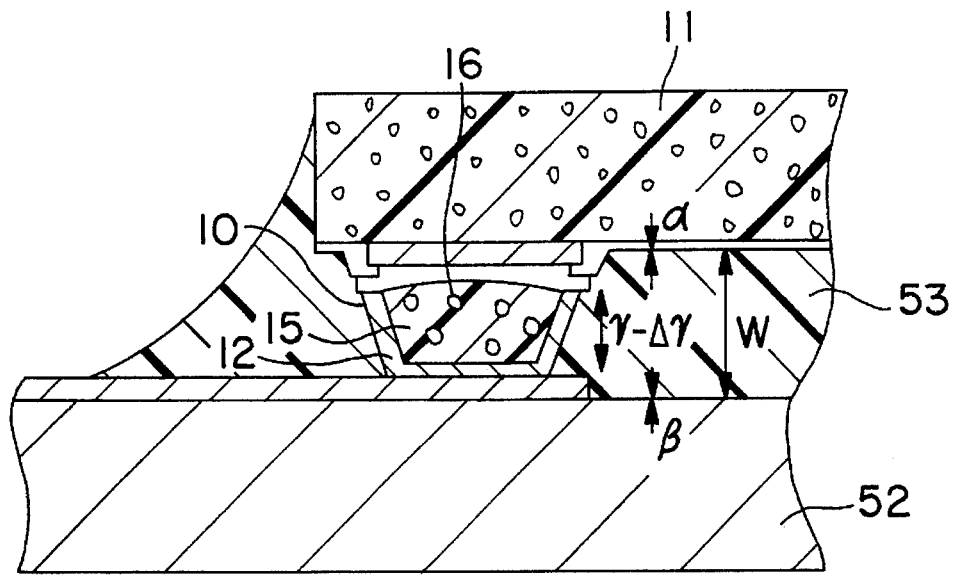
FIG. 6 is an illustration explaining the theory of connection applicable to the connecting method of FIG. 5.

Also, when the variation in height of the patterning electrodes 52 stayed within a limit of 3 to 5 um, the variation could be absorbed by bump electrode 10 without causing any adverse effect to the electrical connection. A theoretical analysis of what is happening in the connecting mechanism presented in FIG. 5 is illustrated in FIG. 6.

A contractile force W of the light settling insulation resin 53, an adhesive force α existent between the LSI chip 11 and the light setting insulation resin 53, and an adhesive force B existent between the circuit board 51 and the light setting insulation resin 53 are exerted on the LSI chip 11 and the circuit board 51.

As a result, the bump electrode 10 and the patterning electrode 52 are compressed and kept in contact with each other. Additionally, the height r of the bump electrode 10 is elastically deformed by Δr due to a mechanical pressure applied during the time of the connecting process and this connecting state is positively maintained.

Figure 7:
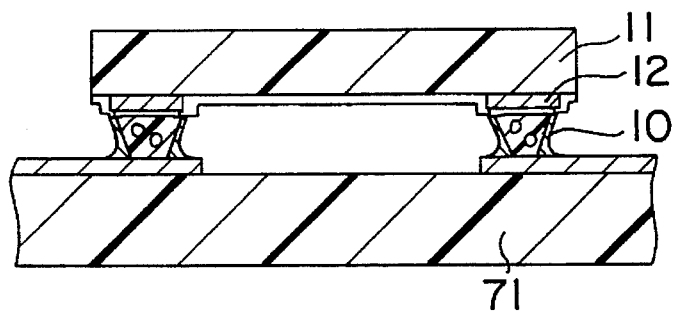
FIG. 7 shows a method of connecting a semiconductor to a circuit board without using any insulation resin.

In addition, as shown in FIG. 7, the bump electrode 10 on the aluminum electrode 12 of the LSI chip 11 can be directly mounted on the circuit board 71.

In this case, the low melting point metallic material composing the surface layer of the bump electrode 10 needs to be solder, tin or the like.

Figure 8:
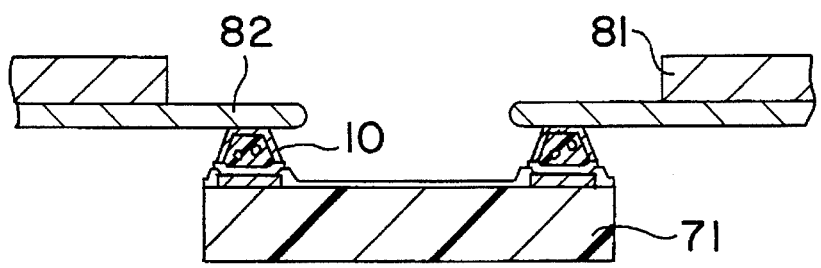
FIG. 8 shows a method of connecting a film carrier to a semiconductor.
Figure 9A:
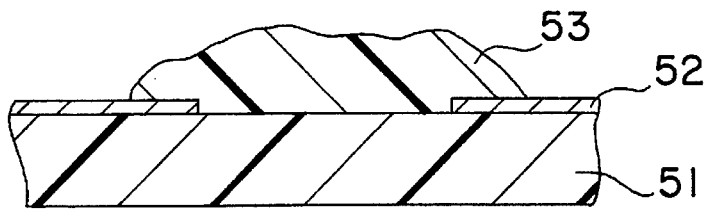
FIGS. 9(a)–9(e) are a series of cross-sectional views illustrating how a semiconductor is connected to a circuit board according to the prior art.
Figure 9B:
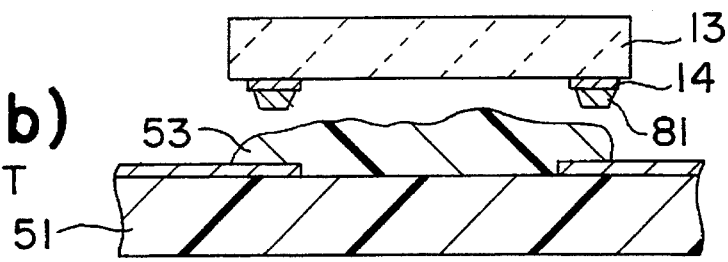
Figure 9C:
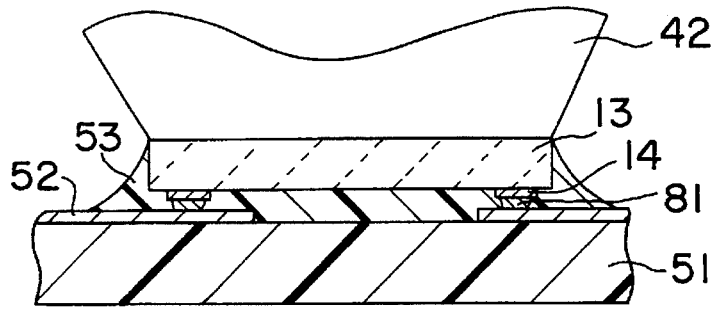
Figure 9D:
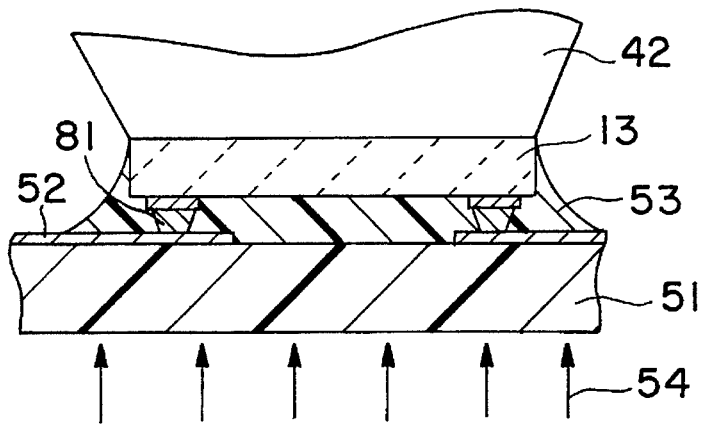
Figure 9E:
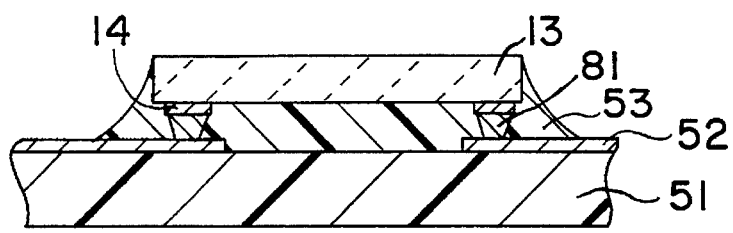

Also, as shown in FIG. 8, the bump electrode 10 can be used in connecting the LSI chip 11 to an inner lead 82 of a film carrier 81, serving as a connecting means. In the exemplary embodiment shown in FIG. 7 and FIG. 8, bump electrodes are formed on aluminum electrodes of an LSI chip according to the method illustrated in FIG. 2 or FIG. 4. The bump electrodes are then connected with a circuit board 71 or a film carrier 81.

This connection is performed in either case through a thermal compression method by means of a pressure application tool. In FIG. 7, the bump electrodes are connected with the patterning electrodes of the circuit board 71 by solder. In FIG. 8, the bump electrodes are connected with the inner leads through an eutectic alloy formed of tin or solder that covers the bump electrode surface and gold or tin on the inner lead surface.

In this way, elasticity is provided to junctions using the present invention's bump electrodes in the junctions, affording the capabilities of withstanding external mechanical and thermal strains.

The bump electrode comprising a resin bump, where numerous cavities are disposed within the bump, and a metallic layer covering the resin bump surface, as disclosed by the present invention, presents the following:

1) An electrical connecting process of an LSI chip can be performed without incurring much strain to the LSI chip since the bump electrodes provided with elasticity serve as a buffer against the mechanical strain caused during the connecting process.

Even when an LSI chip having many electrodes goes through a connecting process, it is possible to carry out a small strain force connection, resulting in a reduction of the damage inflicted upon the LSI chip at the time of connection and enhanced reliability in connection.

2) When a thermal strain (due to thermal expansion) is exerted to a light setting insulation resin due to heat generation caused by an activated LSI chip and an increase in the ambient temperature, the bump electrode and the circuit board electrode are liable to separate from each other. However, an elastic force existent within the bump electrodes is able to keep a good contact between the LSI chip and the patterning electrodes of the circuit board. When the elastic recovering capability of the bump electrode used in the foregoing exemplary embodiments is expressed in terms of the bump electrode deformation, its limit is about 5 um. However, the light setting insulation resin expands only by 1 to 2 um at 200° C.

Consequently, a very stable connection can be realized even under the conditions ranging from a low temperature region to a high temperature region.

3) According to several prior art methods, it has been necessary to control accurately the flatness of a pressure application tool and a circuit board as well as the variation in height distribution of bump electrodes mounted on a chip surface. However, according to the present invention, a variation of 5 um or so in the aforementioned flatness and height can be absorbed by the elasticity incorporated within the bump electrodes.

Therefore, when an LSI chip is mounted on a circuit board directly or by means of a film carrier, more freedom in selecting the circuit board is available. The connecting process performed under a low strain force imposed on the LSI chip eliminates the danger of warping or straining of the chip package with a resultant enhancement of connecting reliability.

What is claimed is:

1. A bump electrode for connecting electronic components comprising in combination:

a metal layer covering a resin core disposed on a substrate said resin core having at least one internal cavity resulting from a photosensitive polyimide resin reacted with a foaming agent and a foam settling agent, said at least one cavity effective to permit said bump to exhibit elastic deformation from 10–30% volume compression.

2. An electrode according to claim 1 wherein said resin core contains a plurality of cavities.

3. An electrode according to claim 1 wherein said metal layers has a low melting point.

4. A bump electrode for connecting electronic components comprising a resin bump having a surface and at least one cavity within said resin bump and a metal layer covering the surface of said resin bump;

wherein said bump electrode is formed on a second electrode which is formed on a first electrode of a semiconductor;

said at least one cavity is produced by using a foaming agent so that said cavity permits said resin bump to exhibit elastic deformation from 10–30% volume compression; and said metal layer is in contact with said second electrode.

* * * * *